United States Patent [19]

Takei et al.

[11] Patent Number: 4,890,164

[45] Date of Patent: Dec. 26, 1989

[54] IMAGE SENSOR HAVING CHARGE STORAGE REGIONS

[75] Inventors: Akira Takei, Yokohama; Teruyuki Nabeta, Tokyo; Tetsuo Nishikawa, Kawasaki; Eiichi Nagai, Yokohama, all of Japan

[73] Assignee: Fujitsu Limited, Kawasaki, Japan

[21] Appl. No.: 253,646

[22] Filed: Oct. 5, 1988

[30] Foreign Application Priority Data

Oct. 9, 1987 [JP] Japan ................. 62-255678

[51] Int. Cl.$^4$ ............................................. H04N 3/14
[52] U.S. Cl. ............................ 358/213.19; 358/213.11
[58] Field of Search ................ 358/213.19, 213.13, 358/213.11, 166, 169; 357/24 LR

[56] References Cited

U.S. PATENT DOCUMENTS 4,390,791 6/1983 Hatamaka et al. ............ 358/213.11
4,563,708 1/1986 Ishibashi ..................... 358/213.19
4,697,200 9/1987 Miyatake ..................... 357/24 LR

FOREIGN PATENT DOCUMENTS 226953 10/1986 Japan .

Primary Examiner—Jin F. Ng
Assistant Examiner—Stephen Brinich
Attorney, Agent, or Firm—Armstront, Nikaido, Marmelstein, Kubovcik & Murray

[57] ABSTRACT

An image sensor includes a plurality of potential monitoring transistors connected to respective floating electrodes for separately monitoring changes in potential of the respective floating electrodes. In addition, the image sensor includes an output circuit for producing an output signal which varies in accordance with one of the monitored potentials which is one of the highest potential and the lowest potential.

20 Claims, 8 Drawing Sheets

IMAGE SENSOR HAVING CHARGE STORAGE REGIONS

BACKGROUND OF THE INVENTION

The present invention generally relates to an image sensor, and in particular to an image sensor such as a charge-coupled device image sensor having charge storage regions. More particularly, the present invention relates to an image sensor capable of detecting a greatest charge amount and a smallest charge amount in real time by separately monitoring potentials of floating electrodes formed above respective charge storage regions. The present invention is suitably applied to a camera and so on.

As is well known, a solid image sensor such as a charge-coupled device (hereinafter simply referred to as a CCD image sensor) is widely used in various fields of a facsimile machine, a camera and so on. A conventional CCD image sensor has a function of only transferring stored charges which are generated by irradiation of light and which are then stored in charge storage regions. Such a CCD image sensor can be used in ah application in which the intensity of light to be processed is limited within a certain range, such as a facsimile machine. However, the CCD image sensor having only the charge transfer function, is not suitable for an application in which a dynamic range of light in intensity to be processed is great, such as a camera. For example, the amount of light applied to a photodiode built in the CCD image sensor may become excessive due to strong illuminance of an object. In this case, a charge storage region overflows with a stored charge. On the other hand, when the amount of light received by a photodiode is insufficient, the sensitivity of the image sensor is decreased, and thereby the image sensor do not sufficiently functions as an image sensor.

In order to overcome the above problems, the applicant has proposed an improved CCD image sensor in the Japanese Laid-Open Patent Application No. 61-226953. The proposed image sensor has an automatic gain control function, in which a time during which a charge is stored in a charge storage region, is determined by sensing an optical state of a CCD image sensor in real time. The optical state of the CCD image sensor is obtained by detecting an average in amounts of the charges which are generated by the respective photodiodes, and are then stored in the respective charge storage regions of the CCD image sensor. The storage electrodes (floating electrodes) formed above charge storage regions are mutually connected. A potential of the mutually connected floating electrodes is monitored. The potential changes, depending on the amount of light received by the CCD image sensor. The measured potential corresponds to the average amount of the charges stored in the charge storage regions. When the potential of the mutually connected floating electrodes exceeds a reference potential, the CCD image sensor is considered being about to overflow. Therefore at this time, a charge transfer operation is activated.

However, the proposed image sensor has disadvantages described below. The optical state of the CCD image sensor is monitored by obtaining the average amount of charges stored in charge storage regions. Therefore, the average amount of charges may be smaller than the reference level, through a charge storage region overflows with excessive charges. Further, the average amount may be kept almost constant, through the greatest charge amount and/or the smallest charge amount changes every moment. In other words, the average of the amounts of charges does not completely correspond to a change in intensity of light.

SUMMARY OF THE INVENTION

Accordingly, a general object of the present invention is to provide an image sensor in which the above disadvantages are eliminated.

A more specific object of the present invention is to provide an image sensor capable of monitoring an optical state of the image sensor by detecting a greatest storage charge amount and/or a smallest storage charge amount in real time.

The above objects of the present invention are achieved by an image sensor comprising elements described below. A plurality of charge storage regions store charges from respective photodiodes. The plurality of charge storage regions include respective floating electrodes, which varying in potential in accordance with amounts of charges stored in the respective charge storage regions. Charge transfer regions transfer the charges from the plurality of charge storage regions in response to a predetermined transfer clock. A plurality of potential monitoring transistors are connected to the respective floating electrodes for separately monitoring changes in potential of the respective floating electrodes. An output circuit produces an output signal which varies in accordance with one of the monitored potentials which is one of the highest potential and the lowest potential.

Other objects, features and advantages of the present invention will become apparent from the following detailed description when read in conjunction with the accompanying drawings.

DETAILED DESCRIPTION

A description is given of a preferred embodiment with reference to FIGS. 1 through FIG. 4. The embodiment is designed so as to detect a largest storage charge amount in a charge storage region which has a plurality of potential wells provided for respective photodiodes.

Figure 2:
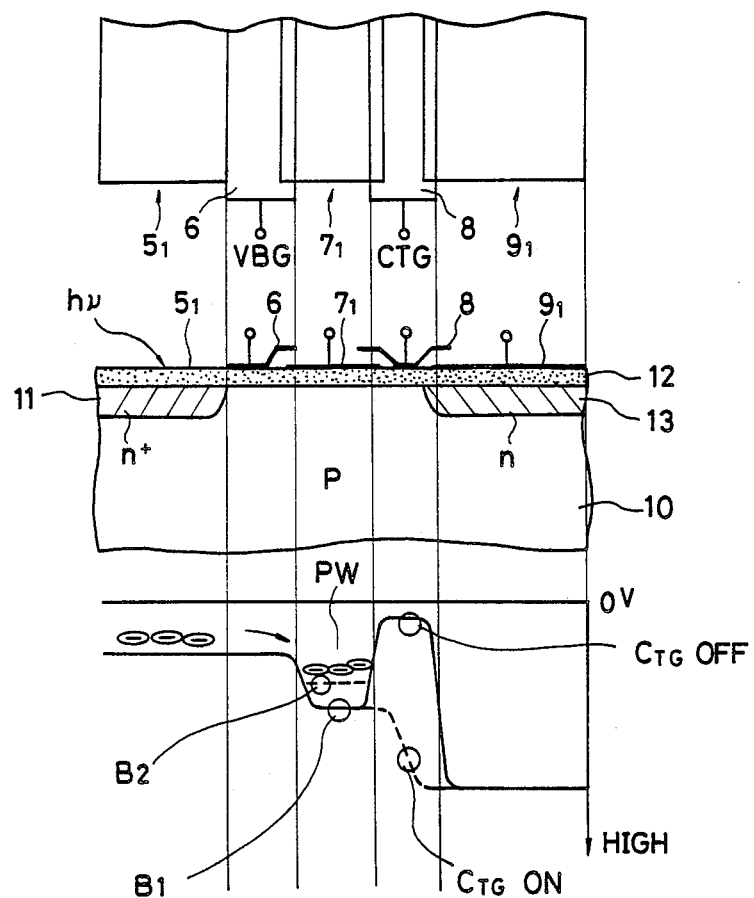
FIG. 2 is a view for showing an elevational cross section taken along a line II—II of FIG. 1 and for flow of a charge generated in a photodiode included in the embodiment.

A CCD image sensor 1 includes a photo sensitive portion 5, a charge storage portion 7 and a transfer portion 9. These portions are formed on a single silicon substrate. The photo sensitive portion 5 includes n number of photodiodes. For the sake of simplicity, only four photodiodes $5_1$–$5_4$ are shown. This holds true for other structural elements of the CCD image sensor 1. As shown in FIG. 2, each of the photodiodes $5_1$–$5_4$ includes an n+-type diffusion layer 11 formed in a p-type silicon substrate 10. A silicon oxide film 12, which is optically transparent, is formed on the entire surface of the silicon substrate 10. Light which enters in each of the photodiodes 5 generates a charge, or a pair of an electron and a hole due to light excitation energy of the light. The generated charges pass through a substrate portion under a bias gate electrode 6, to which a bias gate source voltage $V_{BG}$ is applied, and are then transferred to the charge storage portion 7.

The charge storage portion 7 has a plurality of charge storage regions, each of which has a metal-oxide-semiconductor (MOS) structure. That is, the charge storage regions comprise respective charge storage gates $7_1$–$7_4$, which are formed on the silicon oxide film 12 which is deposited on the silicon substrate 10. The MOS structure forms a capacitor, which stores a charge transferred from the related photodiode. The charge storage gates $7_1$–$7_4$ are separately kept in a floating state. The charge storage gates $7_1$–$7_4$ are hereinafter referred to as floating electrodes. It is noted that the floating electrodes described in the aforementioned Application are mutually connected in order to obtain the average of the amounts of stored charges.

Figure 3:
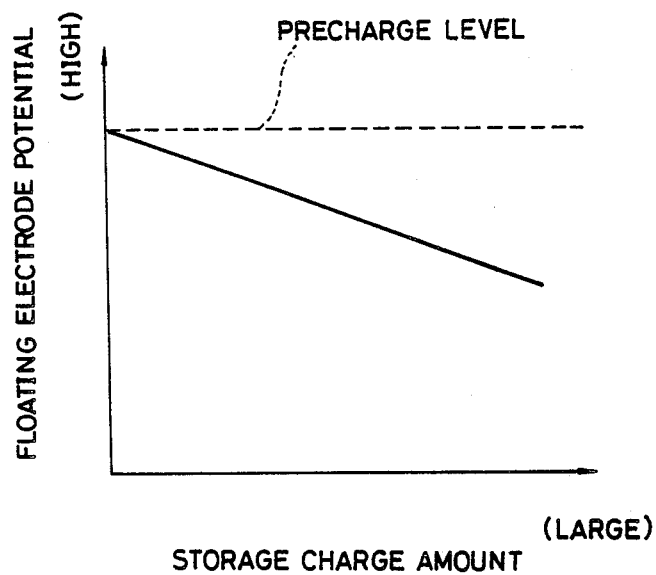
FIG. 3 is a graph showing a relationship of a floating electrode potential vs. a storage charge amount.

The floating electrodes $7_1$–$7_4$ are provided with respective n-channel MOS transistors T11–T14 (hereinafter referred to as NMOS transistors). Sources of the NMOS transistors T11–T14 are connected to the floating electrodes $7_1$–$7_4$, respectively. Drains of the NMOS transistors T11–T14 are supplied with a positive constant source voltage $V_A$, and gates thereof are supplied with a preset clock pulse signal P. When the preset clock pulse signal P is switched to a high level, the NMOS transistors T11–T14 are turned ON. Thereby, the positive source voltage $V_A$ is applied to the floating electrodes $7_1$–$7_4$, so that the floating electrodes $7_1$–$7_4$ are preset. The power source voltage $V_A$ is set equal to +5 volts, for example. The application of the power source voltage $V_A$ forms a potential well PW in a bulk portion of the silicon substrate 10 under each of the floating electrodes $7_1$–$7_4$, as shown in FIG. 2. The potential well PW obtained when there is no charge therein, is shown by a solid line B1 in FIG. 2. The charges generated at the photodiodes are stored in the respective potential wells PW. The potential of each of the floating electrodes 7 is altered, depending on the amount of the stored charge in the corresponding potential well PW. In general, a gate electrode of an n-channel MOS capacitor which is kept in the floating state, decreases in potential, as the stored charge becomes larger in amount, as shown in FIG. 3. Therefore, the floating electrodes $7_1$–$7_4$ follow the above. That is, the floating electrodes $7_1$–$7_4$ have an initial potential of 5 volts in the case where there is no storage charge in the respective potential wells PW. Then, the floating electrodes $7_1$–$7_4$ have respective decreased potentials in response to increased amounts of the respective stored charges. In other words, the potentials of the floating electrodes $7_1$–$7_4$ decrease toward zero volt, depending on increased amounts of the respective stored charges. A decreased potential is shown by a broken line B2 in FIG. 2.

The transfer portion 9 includes transfer electrodes $9_1$ to $9_4$. First and second transfer clock signals $\phi_1$ and $\phi_2$ are supplied to the transfer electrodes $9_1$ to $9_4$. The first and second transfer clock signal $\phi_1$ and $\phi_2$ have the same duty ratio and are 180° out of phase. The charges stored in the respective potential wells PW are transferred to n-type regions 13 under the respective transfer electrodes $9_1$–$9_4$ in response to the application of a transfer gate clock signal $C_{TG}$ to a transfer gate 8. In FIG. 2, the solid potential curve is with respect to a case where no transfer gate clock signal $C_{TG}$ is applied to the transfer gate 8, and the broken potential curve is with respect to a case where the transfer gate clock signal $C_{TG}$ is applied to the transfer gate 8. Then, the charged are transferred in synchronism with the first and second transfer clock signals $\phi_1$ and $\phi_2$, and are sequentially read out through an output terminal OUT.

P-channel MOS transistors (hereinafter simply referred to as PMOS transistors) T21–T24 are provided for the floating electrodes $7_1$–$7_4$, respectively. Gates of the PMOS transistors T21–T24 are connected to the floating electrodes $7_1$–$7_4$, respectively. Drains of the PMOS transistors T21–T24 are connected to ground. It is noted that a resistance across a channel of each PMOS transistor T21–T24 changes, depending on the gate potential thereof, or the potential of the corresponding floating electrode $7_1$–$7_4$. Therefore, the PMOS transistors T21–T24 function as variable resistors. For example, the channel resistance of the PMOS transistor T21 varies depending on the potential of the floating electrode $7_1$. That is, the potential of the floating electrode $7_1$ varies depending on the amount of the charge stored in the potential well PW formed under the floating electrode $7_1$. Sources of the PMOS transistors T21–T24 are connected in common to a signal line L1.

One end of a resistor R21 is connected to the signal line L1. The other end of the resistor R21 is connected to a source of an NMOS transistor T25, a drain of which is connected to a positive source voltage $V_C$. The positive source voltage is set equal to 5 volts, for example. A gate of the NMOS transistor T25 is supplied with a bias voltage $V_{B1}$, and the NMOS transistor T25 is turned On. Thereby the other end of the resistor R21 may be connected directly to the $V_C$ line, and the the signal line L1 is reset at the potential of the voltage $V_C$.

It is preferable that the resistor R21 has a resistance which is sufficiently large than the channel resistances of the PMOS transistors T21–T24. Thereby, the potential at the signal line L1 can be determined, depending on the smallest channel resistance out of the channel resistances of the PMOS transistors T21–T24. In other words, the potential at the signal line L1 is not affected by the PMOS transistors other than the PMOS transistor having the smallest channel resistance. It is noted that the photodiode associated with the PMOS transistor having the smallest channel resistance, receives the largest amount of light. Therefore, the potential of the signal line L1 indicates the largest amount of light. The resistance of the resistor R21 is actually selected so that when the PMOS transistors T21–T24 are in the reset state, the potential of the signal line L1 is approximately equal to the voltage determined by a resistor ratio of R21 to the PMOS transistor T21–T24.

The signal line L1 is connected to a gate of an NMOS transistor T26, a drain of which is supplied with the source voltage $V_A$. A source of the NMOS transistor T26 is connected to a drain of an NMOS transistor T27, a source of which is connected to the ground. A reference voltage $V_{REF1}$ is supplied to a gate of the NMOS transistor T27. The NMOS transistors T26 and T27 function as respective resistors. Channel resistance of the NMOS transistor T26 varies, depending on the potential of the signal line L1. On the other hand, channel resistance of the NMOS transistor T27 is kept constant due to the reference voltage $V_{REF1}$ applied to the gate thereof. Therefore, an output signal extracted at a node between the NMOS transistors T26 and T27, is a voltage signal obtained by dividing the constant voltage $V_A$ by the channel resistances of the NMOS transistors T26 and T27. A ratio of voltage division is determined depending on the gate potential of the NMOS transistor T26, or in other words, the potential of the signal line L1.

Figure 1:
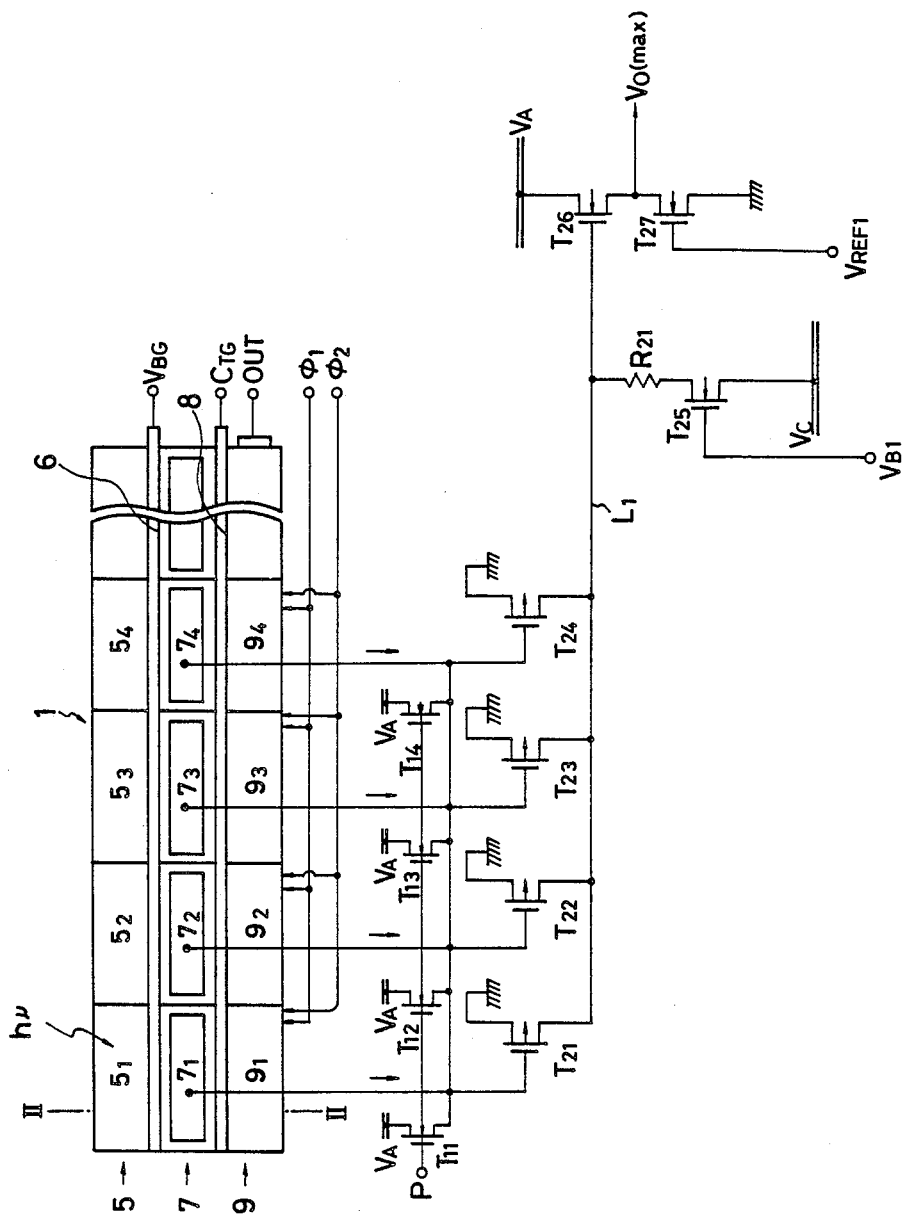
FIG. 1 is a view showing a preferred embodiment of the present invention.
Figure 4:
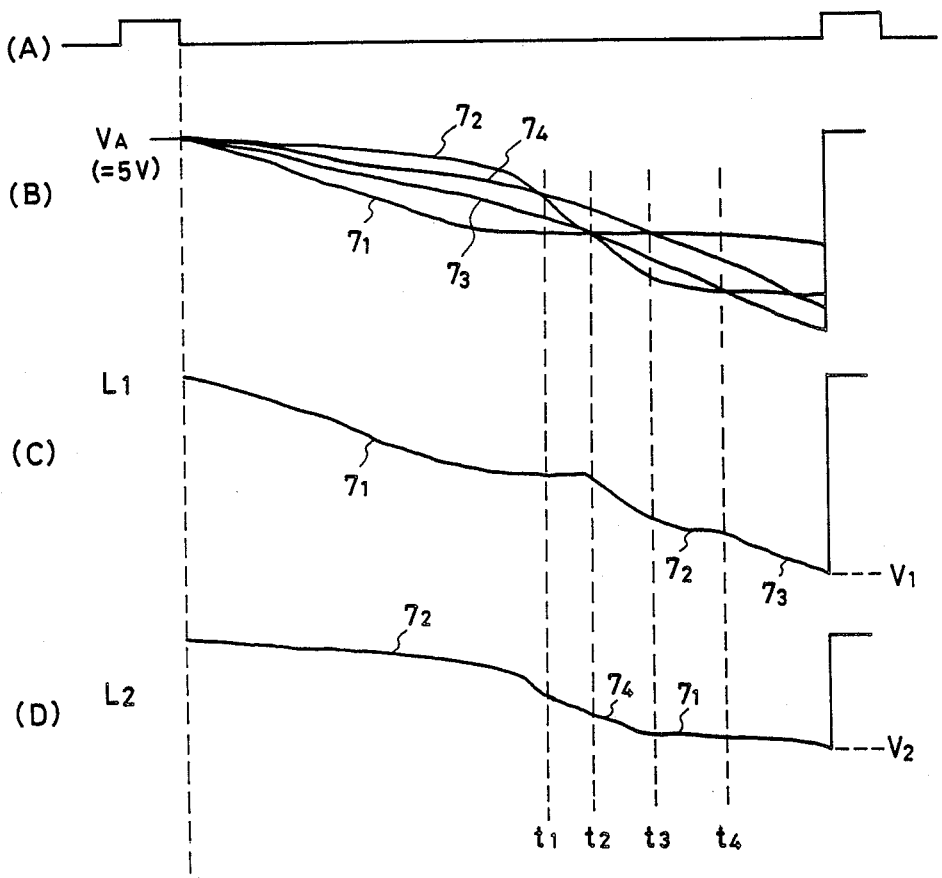
FIGS. 4(A) through 4(D) show waveforms for explaining operations of embodiments of the present invention.

A description is given of an operation of the embodiment with respect to FIG. 4 in addition to FIGS. 1 through 3. FIG. 4(A) shows a waveform of the preset clock pulse signal P, FIG. 4(B) shows potentials of the floating electrodes $7_1$–$7_4$, and FIG. 4(C) shows the output voltage signal Vo(max) indicating the largest amount of charge, which corresponds to the potential level of the signal line L1.

At the time of initialization, the charges generated in the photodiodes $7_1$–$7_4$ are sent to the charge storage portion 7 in response to the application of the bias gate source voltage $V_{BG}$. Then the charges stored in the charge storage portion 7 are transferred to the transfer portion 9 by the application of the transfer gate clock signal $C_{TG}$. Then, the charges are shifted in synchronism with the transfer clock signals $\phi_1$ and $\phi_2$, and are sequentially output. On the other hand, the signal line L1 is reset at the bias potential $V_C$ by the application of the bias voltage $V_{B1}$. Further, the preset clock signal P is applied to the gates of the NMOS transistors, and thereby the floating electrodes $7_1$–$7_4$ are preset at the potential $V_A$. Thereby, the entire image sensor 1 is initialized.

When light is irradiated on the light sensitive portion 5, the photodiodes $5_1$–$5_4$ generate charges, amounts of which correspond to energy amounts of light received by the respective photodiodes $5_1$–$5_4$. The generated charges are transferred to the potential wells PWs formed under the corresponding floating electrodes $7_1$–$7_4$. The charges depending on the respective energy amounts of the light are stored in the corresponding potential wells PWs. Now assuming that the largest amount of charges is stored in the potential well formed under the floating electrode $7_1$, the floating electrode $7_1$ becomes lower in potential than the other floating electrodes $7_2$–$7_4$. In other words, the potential of the floating electrode $7_1$ becomes closest to zero potential. Therefore, the channel resistance of the PMOS T21 is decreased the most, and thereby most of current passes through the PMOS T21 from the power source $V_C$. Therefore, the PMOS T21 decreases the potential of the signal line L1. That is, the potential of the signal line L1 is determined depending on the channel resistance of the PMOS transistor T21. It can be seen from FIG. 4(B) and 4(C) that the potential of the signal line L1 is decreased so as to follow a decrease of the floating electrode $7_1$ which is the largest.

It is assumed that as shown in FIG. 4(B), at a time $t_2$, the potential of the floating electrode $7_2$ becomes equal to the potentials of the floating electrodes $7_1$ and $7_3$, and then becomes lower than the potentials of the floating electrodes $7_1$, $7_3$ and $7_4$. Therefore, the PMOS transistor T22 has the smallest channel resistance, and thereby the potential of the signal line L1 is determined depending on the channel resistance of the PMOS transistor T22. As a result, after the time $t_2$, the potential of the signal line L1 is decreased so as to follow a decrease in potential of the floating electrode $7_2$. Hereinafter, at a time $t_4$, the potential of the floating electrode $7_3$ becomes equal to the potential of the floating electrode $7_2$, and then becomes lower than the potentials of the floating electrode $7_1$, $7_2$ and $7_4$. Therefore, the potential of the signal line L1 is determined in accordance with the channel resistance of the corresponding PMOS T23 which is the smallest. Therefore, the potential of the signal line L1 is decreased so as to follow a decrease in potential of the floating electrode $7_3$.

As can be seen from the above description, the potential change of the signal line exhibits the largest storage charge amount in real time. The potential of the signal line L1 is applied to the gate of the NMOS transistor T26. The combination of the NMOS transistors T26 and T27 divides the constant power source voltage $V_A$ in accordance with the potential of the signal line L1. Then the output voltage signal Vo(max), or the largest amount of the stored charge is output at the node of the NMOS transistors T26 and T27. The output voltage signal Vo(max) indicates the largest amount of the stored charge in real time. The output voltage signal Vo(max) may be used for controlling timing for applying the transfer gate clock signal $C_{TG}$ to the transfer gate electrode 8. For example, when the output voltage signal Vo(max) becomes lower than a predetermined threshold voltage $V_1$ shown in FIG. 4(C), a certain potential well PW is considered being about to overflow with electrons. Therefore, at this time, the transfer gate clock signal $C_{TG}$ is applied to the transfer gate electrode 8. When the bias voltage $V_{B1}$ is no longer applied to the gate of the NMOS transistor T25, the NMOS transistor T25 is turned OFF, and thereby the operation for detection of the largest amount of stored charge is stopped.

In the embodiment of FIG. 1, either one of the resistor R21 and the NMOS transistor T25 may be used. Where only the NMOS transistor T25 is used, the bias voltage $V_{B1}$ is set equal to 1 volt, for example. A p-channel MOS transistor may be used in place of the NMOS T25. Where only the PMOS is used in place of the resistor R21 and T25, the bias voltage $V_B$ is set at 4 volts, for example.

Figure 5:
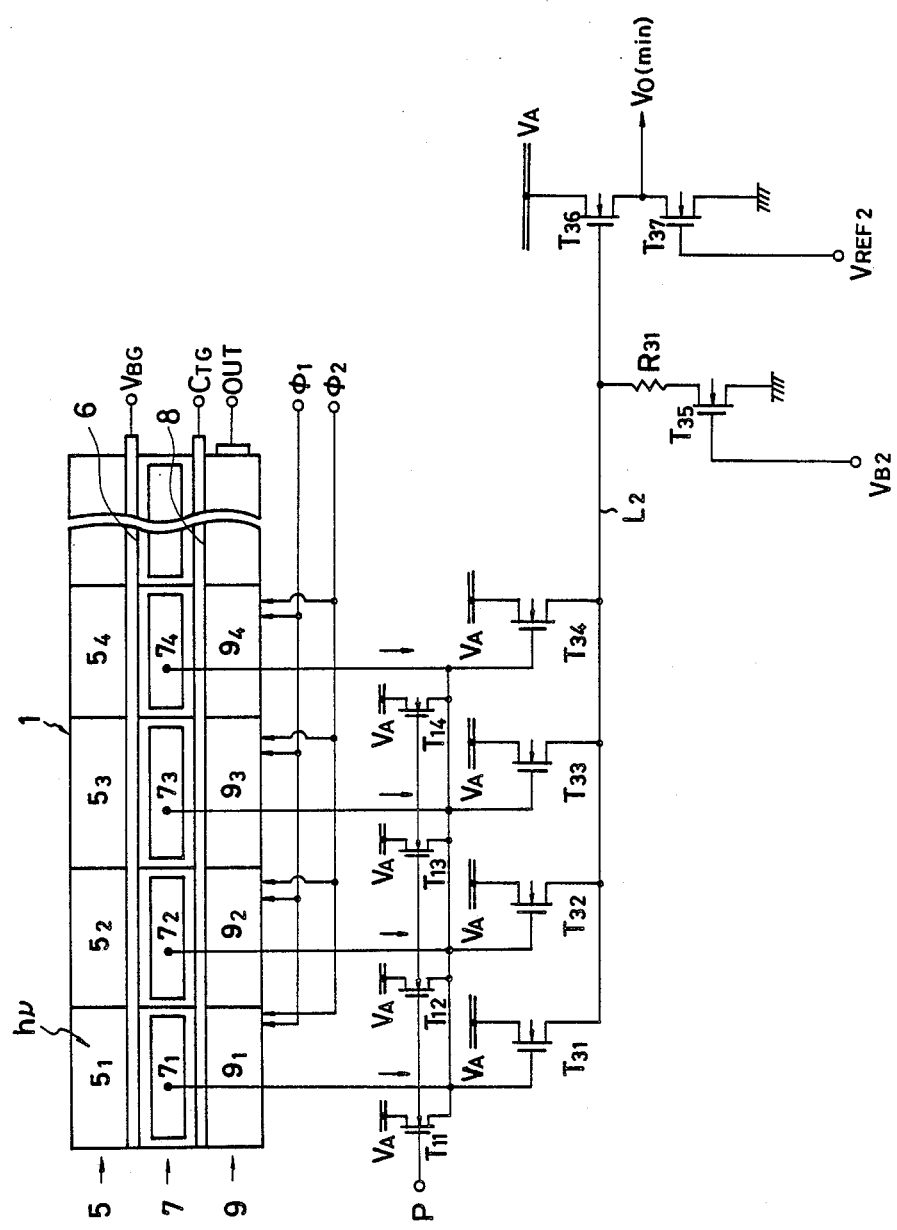
FIG. 5 is a view showing another preferred embodiment of the present invention.

A description is given of another embodiment of the present invention with reference to FIG. 5. In FIG. 5, the same elements as those in FIG. 1 are indicated by the identical reference numerals. The embodiment of FIG. 5 is designed so as to detect a smallest amount of stored charge.

Referring to FIG. 5, n-channel MOS transistors T31-T34 are provided for the respective floating electrodes 7-$7_4$. Gates of the NMOS transistors T31-T34 are connected to the floating electrodes $7_1$–$7_4$, respectively. The positive power source voltage $V_A$ (5 volts, for example) are supplied in common to drains of the NMOS transistors T31-T34. Sources of the NMOS transistors T31-T34 are mutually connected to a signal line L12. Each of the NMOS transistors T31-T34 functions as a variable resistor. That is, the channel resistances of the NMOS transistors T31-T34 are varied in accordance with the respective gate potentials. It is noted that the channel resistances of the NMOS transistors T31-T34 increase as the respective potentials decrease.

An end of a resistor R31 is connected to the signal line L2. The other end of the resistor R31 is connected to a drain of an NMOS transistor T35, a source of which is connected to the ground. A gate of the NMOS transistor T35 is supplied with a bias voltage signal $V_{B2}$, which may be identical to or different from the bias voltage signal $V_{B1}$ in the first embodiment of FIG. 1. When the bias voltage signal $V_{B2}$ is applied to the gate of the NMOS transistor T35, it is turned ON, and thereby the resistor R31 becomes connected to the ground. A resistance of the resistor R31 is selected so as to be sufficiently larger than channel resistances of the NMOS transistors T31–T34. Thereby, the potential of the signal line L2 can be determined, depending on the smallest channel resistance out of four channel resistances of the NMOS transistors T31–T34.

The signal line L2 is connected to a gate of an NMOS transistor T36. The power source voltage $V_A$ is supplied to a drain of the NMOS transistor T36, a source of which is connected to a drain of an NMOS transistor T37. A source of the NMOS transistor T37 is connected to the ground. A gate of the NMOS transistor T37 is kept at a reference voltage signal $V_{REF2}$. The NMOS transistors T36 and T37 function as respective resistors which are connected in series. The constant voltage $V_A$ is divided depending on the potential of the signal line L2. A ratio of voltage division depends on the potential of the signal line L2. A divided output voltage signal Vo(min) is outputted at a node between the NMOS transistors T36 and T37. The output voltage signal Vo(min) exhibits the smallest storage charge amount in real time.

A description is given of an operation of the embodiment of FIG. 5 with reference to FIGS. 4(A), 4(B) and 4(D) in addition to FIG. 5.

At the commencement of the operation, initialization is carried out as in the case of the first embodiment of FIG. 1. By the initialization, the potentials of the floating electrodes $7_1$–$7_4$ are set at the initial potential $V_A$ (5 volts, for example). The potential of the signal line L2 is set nearly equal to the voltage determined by a resistance ratio of R31 to the NMOS transistors T31–T34.

The channel resistances of the NMOS transistors T31–T34 vary in accordance with the respective gate potentials which depend on charge amounts stored in the respective potential wells PWs. The floating electrode having the smallest amount of the stored charge, has the highest potential, or in other words, is closest to the source voltage $V_A$. If the floating electrode $7_1$ has the highest potential, the corresponding NMOS transistor T31 has the smallest channel resistance at this time. Therefore, most of current from the power source $V_A$ passes through the NMOS T31, and thereby the potential of the signal line L2 is determined in accordance with the smallest resistance thereof. For example, if the floating electrode $7_1$ is still kept at the initial potential, no increase in the channel resistance of the NMOS transistor T31 occur. Therefore, the potential of the signal line is kept.

In the case of FIG. 4, after the initialization, the potential of the floating electrode $7_2$ is the highest. That is, the photodiode $5_2$ receives the smallest energy amount of light. During this time, the potential of the signal line L2 is determined in accordance with the channel resistance of the NMOS transistor T32 which depends on the potential of the floating electrode $7_2$. At a time $t_1$, the potential of the floating electrode $7_2$ becomes equal to that of the floating electrode $7_4$, and then the potential of the floating electrode $7_4$ becomes the highest. Therefore, the channel resistance of the corresponding NMOS transistor T34 becomes the smallest, and thereby the potential of the signal line L2 is determined in accordance with the smallest channel resistance of the NMOS transistor T34. Then at a time $t_3$, the potential of the floating gate $7_1$ becomes equal to that of the floating gate $7_4$, and then becomes higher than potentials of the other floating gates $7_2$–$7_4$. Therefore the potential of the signal line L2 is decided in accordance with the channel resistance of the NMOS transistor T31.

Responsive to the potential of the signal line L2, the constant power source voltage $V_A$ is divided, and the output voltage signal Vo(min) is output. The output voltage signal Vo(min) exhibits the smallest amount of the stored charge in real time. The output voltage signal Vo(min) may be used for controlling a time at which the transfer gate clock signal $C_{TG}$ is stopped. For example, when the output voltage signal Vo(min) becomes smaller than a predetermined threshold potential $V_2$ of FIG. 4(D), which corresponds to a charge amount below which the detection of light cannot be carried out correctly.

In the embodiment of FIG. 5, either one of the resistor R31 and the NMOS transistor T35 may be used. A PMOS transistor may be used instead.

Figure 6:
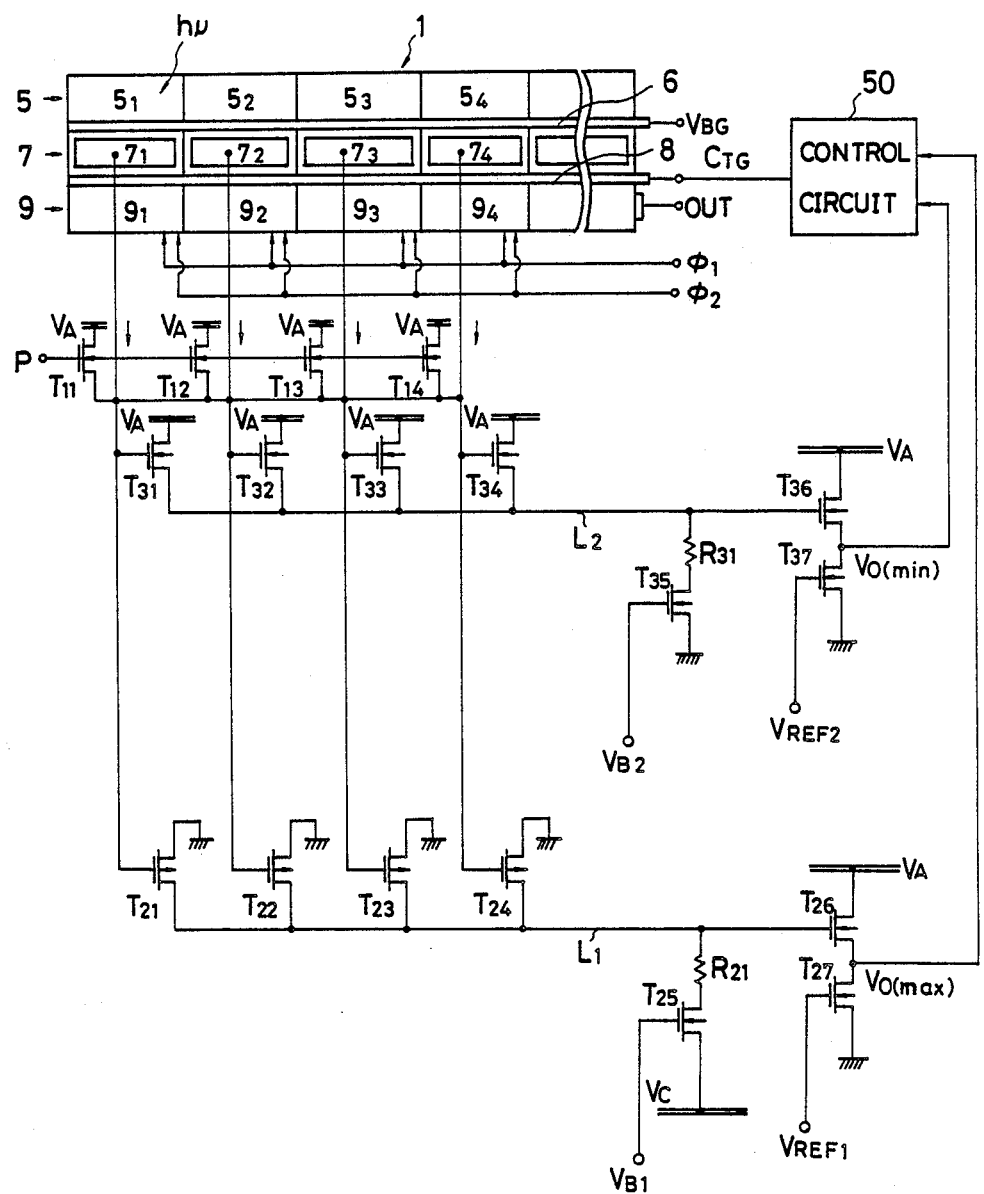
FIG. 6 is a view showing yet another preferred embodiment of the present invention.

A description is given of yet another embodiment of the present invention with reference to FIG. 6. The embodiment of FIG. 6 corresponds to a combination of the structures of FIGS. 1 and 5. In FIG. 6, those parts which are the similar to those parts in FIGS. 1 and 5 are given the same designations and a description thereof will be omitted. Referring to FIG. 6, the gates of the PMOS transistors T21–T24 and the NMOS transistors T31–T34 are connected to the respective floating electrodes $7_1$–$7_4$. The output voltage signals Vo(max) and Vo(min) are supplied to a control circuit 50. The control circuit 50 generates the transfer gate clock signal $C_{TG}$ on the basis of the output voltage signals Vo(max) and Vo(min). When the output voltage signal Vo(max) becomes equal to or lower than the threshold level $V_1$, the control circuit 50 generates the transfer gate clock signal $C_{TG}$. Thereby, the charges stored in the potential wells PWs formed under the floating electrodes $7_1$–$7_4$ are transferred to the transfer portions $9_1$–$9_4$. This enables all the charges to be transferred, when a potential well PW is about to overflow with electrons. Similarly, when the output voltage signal Vo(min) becomes equal to or lower than the threshold voltage $V_2$, the control circuit 50 generates the transfer gate clock signal $C_{TG}$. This enables all the charges to be transferred when a minimum mount of charges necessary for exposure is obtained. That is, very weak light can be detected.

Figure 7:
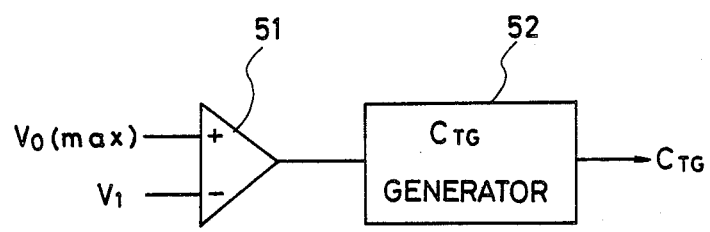
FIG. 7 is a circuit diagram of a control circuit 50 shown in FIG. 6.

FIG. 7 shows a circuit of the control circuit 50 shown in FIG. 6. As shown, the control circuit 50 comprises a comparator $5_1$ and a $C_{TG}$ generator $5_2$. The comparator $5_1$ performs a discrimination operation between the output voltage signal Vo(max) and the threshold voltage $V_1$. The $C_{TG}$ generator $5_2$ is triggered in response to an output signal of the comparator $5_1$, and then generates the transfer gate clock signal $C_{TG}$. The generated transfer gate clock signal $C_{TG}$ is supplied to the transfer gate 8. The control circuit 50 may be built in the CCD image sensor 1, and may be provided as a peripheral circuit thereof.

Figure 8:
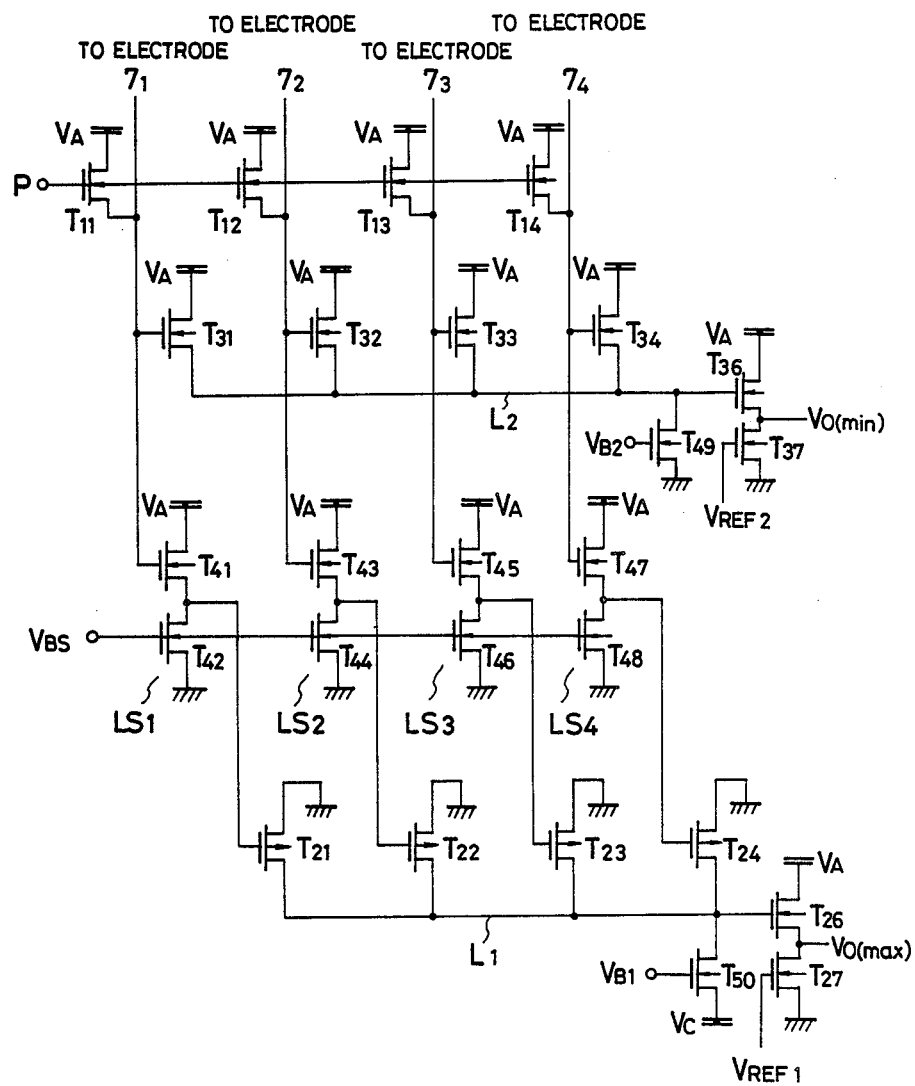
FIG. 8 is a circuit diagram of a modification of the circuit shown in FIG. 7.

FIG. 8 is a modification of the embodiment of FIG. 6. The portions 5, 7 and 9, the gates 6 and 8, and the control circuit 50 shown in FIG. 6 is omitted in FIG. 8 for the sake of simplicity. The feature of the modification is the presence of level shift circuits LS1–LS4, each provided for the respective floating electrodes $7_1$–$7_4$. It is desirable to operate the NMOS transistors T31–T34 within an operable voltage range as high as possible, because the NMOS transistors T31–T34 are of an n-channel type. On the other hand, it is desirable to operate the PMOS transistors T21–T24 within an operable voltage range as low as possible. The level shift circuit LS1 shifts the potential at the gate of the NMOS transistor T31 by a predetermined level. Similarly, the level shift circuits LS2–LS4 shift the potentials of the gates of the NMOS transistors T32–T34 by the predetermined level. The level shift circuit LS1 comprises NMOS transistors T41 and T42. A gate of the NMOS transistor T41 is connected to the gate of the NMOS transistor T31 A drain of the NMOS transistor T41 is provided with the power source voltage $V_A$. A source of the NMOS transistor T41 is connected to a drain of the NMOS transistor T42, a source of which is connected to the ground. A gate of the NMOS transistor T42 is provided with a bias signal $V_{BS}$. A level to be shifted can be adjusted by the level of the The bias signal $V_{BS}$. n control a level shift amount of the level shift circuit LS1. Similarly, the level shift circuits LS2, LS3 and LS4 include NMOS transistors T43 and T44, T45 and T46, and T47 and T48. The signal line L2 is biased by an NMOS transistor T49, and the signal line L1 is biased by an NMOS transistor T50. It is noted that resistors such as the aforementioned resistors R21 and R31 are not employed in the modification of FIG. 8, because those resistors are necessarily elements for biasing the signal lines L1 and L2. In place of the NMOS transistors T49 and T50, only resistors such as the resistors R21 and R31 may be used for biasing the signal lines L1 and L2.

The present invention is not limited to the embodiments and the modification, and variations and modifications may be made without departing from the scope of the present invention.

What is claimed is:

1. An image sensor comprising:
   a plurality of photodiodes;
   a plurality of charge storage regions for storing charges from the respective photodiodes, the plurality of charge storage regions comprising respective floating electrodes, potentials of the floating electrodes varying in accordance with amounts of charges stored in the respective charge storage regions;
   charge transferring means for transferring the charges from the plurality of charge storage regions in response to a predetermined transfer clock;
   a plurality of potential monitoring means connected to the respective floating electrodes for separately monitoring changes in potential of the respective floating electrodes; and
   output means for producing an output signal which varies in accordance with one of the monitored potentials, said one of the monitored potentials being one of either a highest potential or lowest potential.

2. An image sensor as claimed in claim 1, wherein each of the plurality of potential monitoring means comprises a variable resistor, a resistance of which changes depending on the potential of the corresponding floating electrode.

3. An image sensor as claimed in claim 1, wherein each of the plurality of potential monitoring means comprises a p-channel metal-oxide-semiconductor (MOS) transistor, and wherein a gate of the p-channel MOS transistor is connected to the corresponding the floating electrode, and a drain of which is connected to ground, and a source thereof is connected to sources of p-channel MOS transistors of other potential monitoring means.

4. An image sensor as claimed in claim 3, wherein the output means comprises bias means for biasing the mutually connected sources of the p-channel MOS transistors of the potential monitoring means.

5. An image sensor as claimed in claim 4, wherein the bias means comprises at least one of a resistor connected to a positive power source and a MOS transistor connected to the positive power source.

6. An image sensor as claimed in claim 1, further comprising preset means for setting all the floating electrodes at a preset potential before sensing light irradiated on the photodiodes.

7. An image sensor as claimed in claim 6, wherein the present means comprises n-channel MOS transistors provided for the respective floating electrodes, and a drain of each of the n-channel MOS transistors is provided with the predetermined power source voltage, and a source thereof is connected to the corresponding floating electrode, and a gate thereof is supplied with a preset signal fed from an external circuit.

8. An image sensor as claimed in claim 4, wherein the output means comprises voltage division means for dividing a predetermined power source voltage in accordance with a potential of the mutually connected sources of the p-channel MOS transistors, and a divided voltage is said output signal.

9. An image sensor as claimed in claim 4, wherein the voltage division means comprises first and second n-channel MOS transistors, and a drain of the first n-channel MOS transistor is supplied with the predetermined power source voltage, and a source thereof is connected to a drain of the second n-channel MOS transistor, and a gate of the first n-channel MOS transistor is connected to the mutually connected sources of the p-channel MOS transistors of the potential monitoring means, and wherein a source of the second n-channel MOS transistor is connected to ground, and a gate thereof is provided with a constant bias voltage.

10. An image sensor as claimed in claim 1, wherein each of the plurality of potential monitoring means comprises an n-channel metal-oxide-semiconductor (MOS) transistor, and wherein a gate of the n-channel MOS transistor is connected to the corresponding the floating electrode, and a drain of which is supplied with a predetermined power source voltage, and a source thereof is connected to sources of n-channel MOS transistors of other potential monitoring means.

11. An image sensor as claimed in claim 10, wherein the output means comprises bias means for biasing the mutually connected sources of the n-channel MOS transistors of the potential monitoring means.

12. An image sensor as claimed in claim 10, wherein the bias means comprises at least one of a resistor connected to ground and a MOS transistor connected to the ground.

13. An image sensor as claimed in claim 10, wherein the output means comprises voltage division means for dividing a predetermined power source voltage in accordance with a potential of the mutually connected sources of the n-channel MOS transistors, and a divided voltage is said output signal.

14. An image sensor as claimed in claim 10, wherein the voltage division means comprises first and second n-channel MOS transistors, and a drain of the first n-channel MOS transistor is supplied with the predetermined power source voltage, and a source thereof is connected to a drain of the second n-channel MOS transistor, and a gate of the first n-channel MOS transistor is connected to the mutually connected sources of the n-channel MOS transistors of the potential monitoring means, and wherein a source of the second n-channel MOS transistor is connected to ground, and a gate thereof is provided with a constant bias voltage.

15. An image sensor comprising:
a plurality of photodiodes;
a plurality of charge storage regions for storing charges from the respective photodiodes, the plurality of charge storage regions comprising respective floating electrodes, potentials of the floating electrodes varying amounts of charges stored in the respective charge storage regions;
charge transferring means for transferring the charges from the plurality of charge storage regions in response to a predetermined transfer clock;
a plurality of potential monitoring means connected to the respective floating electrodes for separately monitoring changes in potential of the respective floating electrodes;
first output means for producing a first output signal which varies in accordance with one of the monitored potentials which is a highest; and
second output means for producing a second output signal which varies in accordance with one of the monitored potentials which is a smallest.

16. An image sensor as claimed in claim 15, wherein each of the plurality of the potential monitoring means comprises a first variable resistor and a second variable resistor, and wherein the first variable resistor decreases its resistance with a decrease in potential of the corresponding floating electrode, and wherein the second variable resistor increases its resistance with a decrease in potential of the corresponding floating electrode.

17. An image sensor as claimed in claim 16, wherein the first variable resistor comprises a p-channel MOS transistor, and the second variable resistor comprises an n-channel MOS transistor.

18. An image sensor as claimed in claim 16, wherein the first variable resistors are connected directly to the respective floating electrodes, and wherein the image sensor further comprises a plurality of level shift means provided for the respective floating electrodes for shifting the potential of the respective floating electrodes by a predetermined level, and wherein level-shifted potentials of the floating electrodes are supplied to the respective second variable resistors.

19. An image sensor as claimed as claim 18, wherein each of the level shift means comprises a first n-channel MOS transistor and a second n-channel MOS transistor, and wherein gates of the first n-channel MOS transistors are connected to the respective floating electrodes, and gates of the second n-channel MOS transistors are supplied with a constant voltage signal, and wherein drains of the first n-channel MOS transistors are supplied with the predetermined power source voltage, and sources thereof are connected to drains of the corresponding second n-channel MOS transistors, and sources of the second n-channel MOS transistors are connected to ground.

20. An image sensor as claimed in claim 15, further comprising control means for generating a clock signal which determines timing for transferring the charges stored in the charge storage regions to the transfer means on the basis of the first and second output signals derived from the first and second output means.

* * * * *